United States Patent
Rompf et al.

(10) Patent No.: US 10,633,563 B2
(45) Date of Patent: *Apr. 28, 2020

(54) BARRIER ADHESIVE MASS WITH POLYMER GETTER MATERIAL

(71) Applicant: TESA SE, Norderstedt (DE)

(72) Inventors: Julia Rompf, Hamburg (DE); Christian Schuh, Hamburg (DE); Martin Recher, Villeneuve d'Ascq (FR); Mengwei Cao, Aachen (DE)

(73) Assignee: TESA SE, Norderstedt (DE)

( * ) Notice: Subject to any disclaimer, the term of this patent is extended or adjusted under 35 U.S.C. 154(b) by 75 days.

This patent is subject to a terminal disclaimer.

(21) Appl. No.: 15/770,424

(22) PCT Filed: Oct. 25, 2016

(86) PCT No.: PCT/EP2016/075645
§ 371 (c)(1),
(2) Date: Apr. 23, 2018

(87) PCT Pub. No.: WO2017/080813
PCT Pub. Date: May 18, 2017

(65) Prior Publication Data
US 2018/0298241 A1    Oct. 18, 2018

(30) Foreign Application Priority Data
Nov. 9, 2015 (DE) .......... 10 2015 222 027

(51) Int. Cl.
*C09J 7/38*        (2018.01)
*C09J 153/00*   (2006.01)
(Continued)

(52) U.S. Cl.
CPC ............ *C09J 7/387* (2018.01); *C08F 230/08* (2013.01); *C08L 43/04* (2013.01); *C08L 63/00* (2013.01);
(Continued)

(58) Field of Classification Search
CPC ..... C09J 7/387; C09J 5/00; C09J 7/381; C09J 2467/006; C09J 2453/00; C09J 2433/00;
(Continued)

(56) References Cited

U.S. PATENT DOCUMENTS 4,051,195 A    9/1977    McWhorter
4,552,604 A    11/1985  Green
(Continued)

FOREIGN PATENT DOCUMENTS

CN    101641418 A    2/2010
DE    102008047964 A1    3/2010
(Continued)

OTHER PUBLICATIONS

German Search Report for corresponding application DE 10 2015 222 027.3 dated Jul. 8, 2018.
(Continued)

*Primary Examiner* — Andrew J. Oyer
(74) *Attorney, Agent, or Firm* — Norris McLaughlin, PA

(57) ABSTRACT

The invention relates to a barrier adhesive mass having high breakthrough times for water and also providing a good adhesive performance. This is achieved by a barrier adhesive mass comprising at least one elastomer and at least one reactive resin, and is characterised in that the barrier adhesive mass comprises at least one polymer G containing at least two functions suitable for constructing a polymer, as well as at least two hydrolysable silyl groups. The invention also relates to an adhesive tape comprising a barrier adhe-
(Continued)

sive mass according to the invention, and to the use of an adhesive mass of this type for sealing electronic assemblies.

14 Claims, 1 Drawing Sheet

(51) Int. Cl.
| | |
|---|---|
| C08F 230/08 | (2006.01) |
| C08L 63/00 | (2006.01) |
| C08L 43/04 | (2006.01) |
| C09J 5/00 | (2006.01) |
| H01L 51/52 | (2006.01) |
| H01L 51/10 | (2006.01) |
| H01L 51/44 | (2006.01) |
| C09J 7/20 | (2018.01) |

(52) U.S. Cl.
CPC .................. *C09J 5/00* (2013.01); *C09J 7/381* (2018.01); *C09J 153/00* (2013.01); *H01L 51/5259* (2013.01); *C09J 2205/114* (2013.01); *C09J 2423/00* (2013.01); *C09J 2433/00* (2013.01); *C09J 2453/00* (2013.01); *C09J 2467/006* (2013.01); *H01L 51/107* (2013.01); *H01L 51/448* (2013.01)

(58) Field of Classification Search
CPC .............. C09J 2423/00; C09J 2205/114; C09J 153/00; C09J 2201/606; C09J 7/20; H01L 51/107; H01L 51/5259; H01L 51/448; C08L 63/00; C08L 43/04; C08F 230/08
See application file for complete search history.

(56) References Cited

U.S. PATENT DOCUMENTS

| | | |
|---|---|---|
| 6,833,668 B1 | 12/2004 | Yamada et al. |
| 2004/0225025 A1 | 11/2004 | Sullivan et al. |
| 2006/0100299 A1 | 5/2006 | Malik et al. |
| 2010/0120931 A1 | 5/2010 | Zajaczkowski et al. |
| 2010/0148666 A1 | 6/2010 | Liu et al. |
| 2011/0073901 A1 | 3/2011 | Fujita et al. |
| 2012/0108733 A1 | 5/2012 | Suwa et al. |
| 2014/0322526 A1 | 10/2014 | Dollase et al. |
| 2015/0162568 A1 | 6/2015 | Bai et al. |
| 2015/0301233 A1* | 10/2015 | Hoshino ............... B32B 7/02 351/159.57 |

FOREIGN PATENT DOCUMENTS

| | | |
|---|---|---|
| DE | 102010043866 A1 | 5/2012 |
| EP | 0733689 A1 | 9/1996 |
| EP | 1037192 A2 | 9/2000 |
| EP | 1394199 A1 | 3/2004 |
| JP | 2000311782 A | 11/2000 |
| JP | 2004296381 A | 10/2004 |
| JP | 2008101168 A | 5/2008 |
| JP | 2014074097 A | 4/2014 |
| JP | 2014532769 A | 12/2014 |
| JP | 2015529934 A | 10/2015 |
| JP | 201650255 A | 9/2017 |
| WO | 9821287 A1 | 5/1998 |
| WO | 03065470 A1 | 8/2003 |
| WO | 2007087281 A1 | 8/2007 |
| WO | 2009148716 A2 | 12/2009 |
| WO | 2009148716 A3 | 12/2009 |
| WO | 2013096272 A1 | 6/2013 |
| WO | 2014084351 A1 | 6/2014 |
| WO | 2015154947 A1 | 10/2015 |
| WO | 2016066437 A1 | 5/2016 |

OTHER PUBLICATIONS

Taiwanese Office action in corresponding application TW 105136074 dated Nov. 13, 2018.
International Search Report for corresponding application PCT/EP2016/075645 dated Jan. 5, 2017.
Written Opinion of the International Searching Authority for corresponding application PCT/EP2016/075645 dated Jan. 5, 2017 (English translation not available).
CN Search Report issued in corresponding CN application 201680065405.0 dated Aug. 16, 2019.

* cited by examiner

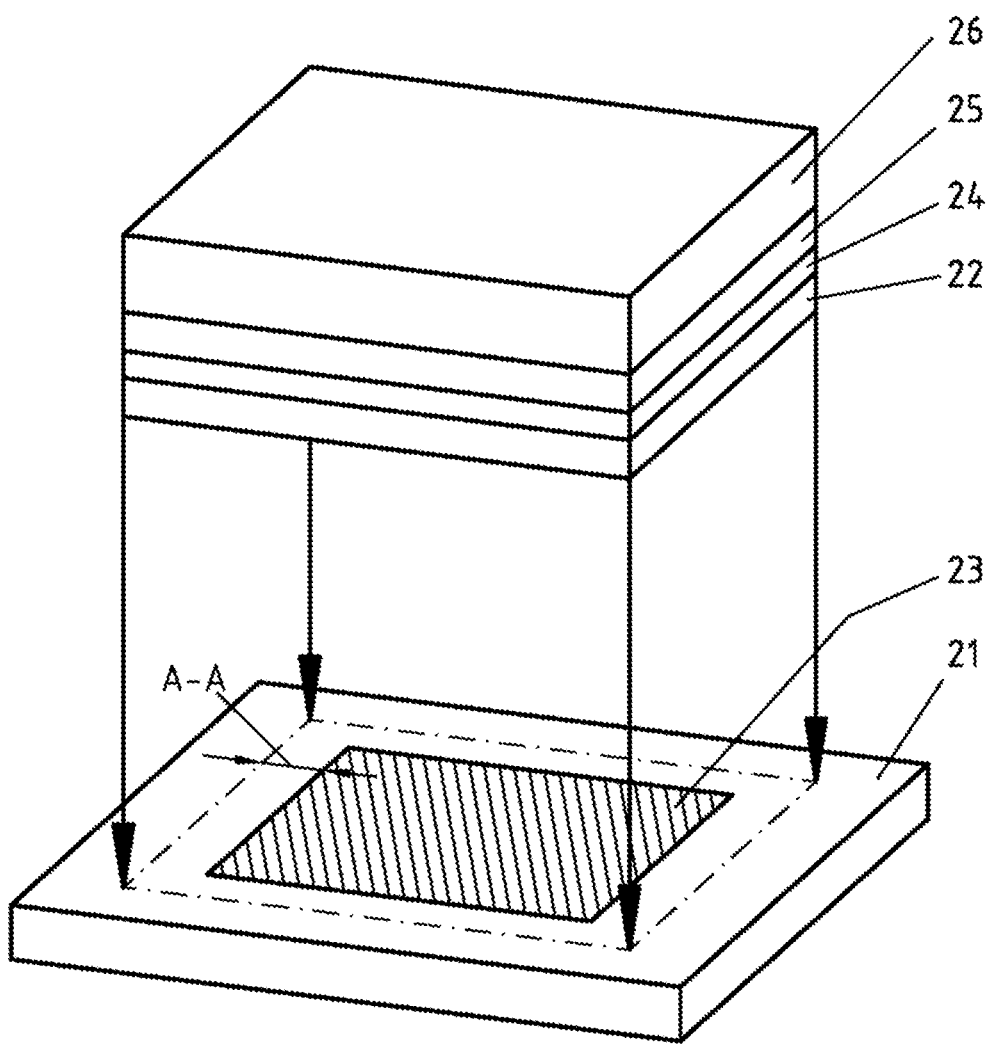

BARRIER ADHESIVE MASS WITH POLYMER GETTER MATERIAL

This is an application filed under 35 USC 371 based on PCT/EP2016/075645 filed 25 Oct. 2016, which in turn is based on DE 10 2015 222027.3 filed 9 Nov. 2015. The present application claims the full priority benefit of these prior applications and herein incorporates by reference the full disclosures of these prior applications.

The present invention relates to the technical field of adhesive compounds, specifically the field of adhesive compounds for encapsulating electronic devices. In particular, a barrier adhesive compound is presented which contains a polymeric getter material.

(Opto)electronic devices are increasingly being used in commercial products. Such devices comprise inorganic or organic electronic structures, for example organic, organometallic, or polymeric semiconductors, and combinations thereof. Depending on the desired application, these devices and products may be stiff or flexible, with there being an increasing demand for flexible devices. Such devices are often produced by means of printing processes such as relief printing, intaglio printing, screen printing, lithographic printing, or so-called "non-impact printing" processes such as thermal transfer printing, laser jet printing, or digital printing. In many cases, however, vacuum processes such as chemical vapour deposition (CVD), physical vapour deposition (PVD), plasma-enhanced chemical or physical deposition (PECVD), sputtering, (plasma) etching, or vapour plating are used, with structuring being carried out as a rule using masks.

Examples of (opto)electronic applications that are already commercially available or have significant market potential include electrophoretic or electrochromic structures or displays and organic or polymeric light-emitting diodes (OLEDs or PLEDs) in advertising or display devices or as illumination, electroluminescent lamps, light-emitting electrochemical cells (LEECs), organic solar cells such as dye or polymeric solar cells, organometallic solar cells, for example based on metal organic frameworks (MOFs) with crystalline porphyrin coatings, inorganic solar cells, for example thin-layer solar cells, particularly based on silicon, germanium, copper, indium or selenium, organic field effect transistors, organic switching elements, organic optical amplifiers, organic laser diodes, organic or inorganic sensors, and organic or inorganic-based RFID transponders.

A special technical challenge in achieving sufficient useful life and functioning of (opto)electronic devices in the area of inorganic and/or organic (opto)electronics, but particularly in the area of the organic (opto)electronics, is protection of the components contained therein from permeates. Permeates may be a variety of low-molecular organic or inorganic bonds, particularly water vapour and oxygen.

Many (opto)electronic devices in the area of inorganic and/or organic (opto)electronics, and particularly in the use of organic raw materials, are sensitive both to water vapour and oxygen, with the penetration of water or water vapour being considered a major problem for many devices. During the useful life of the electronic device, protection by means of encapsulation is therefore required, because performance otherwise decreases over the period of use. For example, oxidation of the components of light-emitting devices such as electroluminescent lamps (EL lamps) or organic light-emitting diodes (OLEDs) can cause a drastic decrease in the brightness of electrophoretic displays (EP displays), contrast, or in solar cells, efficiency, within a very short period of time.

In inorganic and/or organic (opto)electronics, particularly in organic (opto)electronics, there is a particular demand for flexible adhesive solutions, which constitute a permeation barrier for permeates such as oxygen and/or water vapour. In addition, there are a number of further requirements for such (opto)electronic devices. The flexible adhesive solutions should therefore not only provide good adhesion between two substrates, but also have sufficient properties such as high shear resistance and peeling resistance, chemical resistance, aging resistance, high transparency, simple processability, and high flexibility and pliancy.

A common approach of prior art is therefore to place the electronic device between two substrates that are impermeable to water vapour and oxygen. After this, the edges are sealed. For inflexible structures, glass or metal substrates are used, which provide a high permeation barrier, but are highly susceptible to mechanical stresses. Moreover, these substrates cause the thickness of the entire device to be relatively high. In the case of metal substrates, moreover, there is no transparency. For flexible devices, in contrast, flat substrates such as transparent or non-transparent films are used, which may be configured in multiple layers. Here, both combinations of different polymers and inorganic or organic layers are used. The use of such flat substrates allows a flexible, extremely thin structure. This makes it possible to use the widest possible variety of substrates for various applications, such as films, fabrics, webs, and papers or combinations thereof.

In order to achieve the best possible sealing, special barrier adhesive compounds (also referred to as vapour-blocking adhesive compounds) are frequently used. A good adhesive compound for the sealing of (opto)electronic components shows low permeability with respect to oxygen and particularly water vapour, has sufficient adhesion to the device, and can be favourably applied thereto. Low adhesion to the device reduces the barrier effect at the interface, allowing entry of oxygen and water vapour independently of the properties of the adhesive compound. Only if the contact between the compound and substrate is continuous are the compound properties the determining factor for the barrier effect of the adhesive compound.

For characterizing the barrier effect, the OTR (oxygen transmission rate) and the WVTR (water vapour transmission rate) are usually used. In this case, the respective rate indicates the area and time-related flow of oxygen or water vapour through a substrate under specific conditions of temperature and partial pressure, and if applicable, further measurement conditions such as relative humidity. The lower these values are, the better suited the respective material is for encapsulation. Here, indication of permeation is based not only on the values for WVTR or OTR, but always also includes an indication of the average path length of permeation, such as the thickness of the materials or standardization to a particular path length.

The permeability P is a measure of the permeability of a body for gases and/or liquids. A good barrier effect is characterized by a low P value. The permeability P is a specific value for a defined material and a defined permeant under stationary conditions with a specified permeation path length, partial pressure, and temperature. The permeability P is the product of the diffusion term D and the solubility term S: $P = D \cdot S$.

The determination of the water vapour transmission rate (WVTR) is conducted, also within the meaning of the present invention, according to ASTM F-1249. For this purpose, the pressure-sensitive adhesive compound is applied with a layer thickness of 50 µm to a highly-permeable polysulfone membrane (available from Sartorius), which itself does not contribute to the permeation barrier. The water vapour permeability is determined at 37.5° C. and a relative humidity of 90% with a measuring device (Mocon OX-Tran 2/21).

The solubility term S primarily describes the affinity of the barrier adhesive compound for the permeant. In the case of water vapour, for example, a low S value is reached for hydrophobic materials. The diffusion term D is a measure of the mobility of the permeant in the barrier material and is directly dependent on properties such as molecular mobility or free volume. For strongly crosslinked or highly crystalline materials, relatively low D values are reached. As a rule, however, highly crystalline materials are less transparent, and stronger crosslinking leads to lower flexibility. The permeability P ordinarily increases with an increase in molecular mobility, for example even if the temperature is increased or the glass transition temperature is exceeded.

Attempts to increase the barrier effect of an adhesive compound must take into account the two parameters D and S, particularly with respect to the permeability of water vapour and oxygen. In addition to these chemical properties, the influence of physical effects on permeability must be taken into account, particularly the average permeation path length and the interface properties (application behaviour of the adhesive compound, adhesion). The ideal barrier adhesive compound shows low D values and S values with very good adhesion to the substrate.

A low solubility term S alone is usually insufficient to achieve good barrier properties. A classical example of this are siloxane elastomers in particular. The materials are extremely hydrophobic (small solubility term), but because of their freely rotatable Si—O bond (large diffusion term), show a relatively low barrier effect against water vapour and oxygen. A good balance between the solubility term S and the diffusion term D is also necessary for a good barrier effect.

In the past, liquid adhesives and adhesives based on epoxides were primarily used (WO 98/21287 A1; U.S. Pat. Nos. 4,051,195 A; 4,552,604 A). Because of their strong crosslinking, these adhesives have a low diffusion term D. Their main area of application is edge bonding of rigid devices, but also moderately flexible devices. Curing takes place thermally or by means of UV irradiation. Full-area adhesion is virtually impossible due to the contraction resulting from curing, because curing causes stresses to occur between the adhesive and substrate, which in turn can lead to delamination.

However, the use of these liquid adhesives involves a series of drawbacks. For example, low molecular components (VOCs—volatile organic compounds) can damage the sensitive electronic structures of the device and make handling during production more difficult. The adhesive must be applied to each individual component of the device in a time-consuming manner. The procurement of costly dispensers and fixation devices is necessary in order to ensure precise positioning. The mode of application also prevents a rapid continuous process, and because of the low viscosity, the subsequently required lamination step can make it more difficult to achieve a specified layer thickness and width of adhesion within narrow limits.

Furthermore, such highly-crosslinked adhesives show only low flexibility after curing. The use of thermally crosslinking systems is limited in the low temperature range or in 2-component systems by the pot life, or the processing time until gelling has taken place. In the high temperature range, and particularly in the case of long reaction times, the sensitive (opto)electronic structures in turn impair the applicability of such systems—the maximum usable temperatures in (opto)electronic structures are sometimes only 60° C., as initial damage can occur above this temperature. In particular, flexible devices, which contain organic electronics and are encapsulated with transparent polymer films or composites of polymer films and inorganic layers, impose narrow limits here. This also applies for lamination steps under high pressure. In order to achieve improved durability, lamination at low pressure and elimination of a temperature exposure step are advantageous in this case.

In addition to the thermally curable liquid adhesives, radiation-cured adhesives are now widely used (US 2004/0225025 A1). The use of radiation-cured adhesives prevents prolonged thermal stress on the electronic device. However, this irradiation causes short-term local heating of the device, because as a rule, an extremely high dose of IR radiation is emitted in addition to the UV radiation. The above-mentioned drawbacks of liquid adhesives such as VOC content, shrinkage, delamination, and low flexibility are also retained. Problems can also arise due to additional volatile components or decomposition products from the photoinitiators or sensitizers. The device must also be permeable to UV light.

As components of organic electronic devices in particular and many of the polymers used are often sensitive to UV exposure, long-term outside use is not possible without further additional protective measures such as further covering films. In UV curing adhesive systems, these cannot be applied until after UV curing, which further increases the complexity of production and the thickness of the device.

US 2006/0100299 A1 discloses a UV-curable pressure-sensitive adhesive tape for encapsulating an electronic device. The pressure-sensitive adhesive tape comprises an adhesive compound based on a combination of a polymer with a softening point of greater than 60° C., a polymerizable epoxide resin with a softening point of below 30° C., and a photoinitiator. The polymers may be polyurethane, polyisobutylene, polyacrylonitrile, polyvinylidene chloride, and poly(meth)acrylate or polyester, but an acrylate is preferred. Adhesive resins, softeners, or fillers are also included.

Acrylate compounds have quite good resistance to UV irradiation and various chemicals, but widely differing adhesive strengths on different substrates. While the adhesive force on polar substrates such as glass or metal is extremely high, the adhesive force on nonpolar substrates such as polyethylene or polypropylene is rather low. In this case, there is a risk of diffusion at the interface to a particular degree. These compounds are also highly polar, which favours the diffusion of water vapour in particular, despite subsequent crosslinking. This tendency is aggravated by the use of polymerizable epoxide resins.

As a rule, pressure-sensitive adhesive tapes require a certain period of time, sufficient pressure, and a good balance between the viscous component and the elastic component for good wetting and adhesion to the surface because of their content of relatively high molecular polymers, in contrast to liquid adhesives.

WO 2007/087281 A1 discloses a transparent, flexible pressure-sensitive adhesive tape based on polyisobutylene (PIB) for electronic applications, particularly OLEDs. In this case, polyisobutylene having a molecular weight of more than 500,000 g/mol and a hydrated cyclic resin are used. The optional use of photopolymerizable resins and a photoinitiator is also possible.

Because of their low polarity, adhesive compounds based on polyisobutylene provide a good barrier against water vapour, but have relatively low cohesion even at high molecular weights, for which reason they often show low shear resistance and elevated temperatures. The content of low-molecular components cannot be reduced as desired, because otherwise the adhesion is sharply reduced and interfacial permeation increases. In use of a high content of functional resins, which is necessary because of the extremely low cohesion of the compound, the polarity of the compound is again increased, resulting in a larger solubility term.

Moreover, barrier adhesive compounds based on styrene block copolymers and resins that are as highly hydrated as possible are also described (see DE 10 2008 047 964 A1).

The formation of at least two domains within the block copolymer also provides highly favourable cohesion at room temperature, simultaneously with improved barrier properties.

One possible way of further improving the barrier effect is the use of substances which react with water or oxygen. Oxygen or water vapour penetrating the (opto)electronic device is then chemically or physically bonded to these substances, preferably chemically. These substances are referred to in the literature as "getters", "scavengers", "desiccants", or "absorbers". In the following, only the term getter is used. In adhesive compounds, the main such getters described are inorganic fillers such as calcium chloride or various oxides. As such substances are not soluble in the adhesive compound, this results in the drawback that the adhesive compound loses its transparency, and with corresponding degrees of filling, its adhesion. For this reason, organic getters or hybrids that are soluble in the adhesive compound are more suitable, but they must not migrate from the adhesive compound to the organic electronic device. Rather than the diffusion values, these additives substantially alter the penetration time, i.e. the time moisture requires to cross the distance through the adhesive compound and reach the sensitive electronic structure. If the substances are saturated with water or oxygen or consumed in a chemical reaction with water or oxygen, they no longer have any effect, and the diffusion is then only that of the adhesive compound without a getter. Nevertheless, these getters can extend the useful life of the (opto)electronic components.

Examples of the use of getters in liquid adhesive systems for the encapsulation of (opto)electronic structures are presented for example in U.S. Pat. No. 6,833,668 B1, JP 2000311782 A and EP 1037192 A2.

WO 03/065470 A1 also discloses a pressure-sensitive adhesive compound that is used in an electronic structure as a transfer adhesive compound. The adhesive compound contains an inorganic functional filler that reacts with oxygen or water vapour within the structure. This allows simple application of a getter inside the structure. A further adhesive having lower permeability is used for sealing the structure externally. A similar pressure-sensitive adhesive compound is used in JP 2004296381 A. In this case as well, inorganic getters are exclusively used.

DE 102010043866 A1 describes an adhesive compound for encapsulation that contains silane-modified polymers. To a certain extent, the adhesive compound shows improved penetration times compared to the prior art discussed in the literature. Nevertheless, a further improvement in penetration times is desirable.

It is known from prior art that alkoxysilanes can be used as water scavengers. In EP 1394199 A1, alkoxysilanes serve as water scavengers, drying agents, or precrosslinking inhibitors, in other words as stabilizers for highly moisture-crosslinking sealing compounds. In this case, both monomers and oligomeric alkoxysilanes can be used with equal success.

WO 2013/096272 A1 describes glycidyloxy groups containing oligosiloxanes that are intended to impart high chemical resistance to compositions containing organic resins, thus retaining or improving the flexibility of these compositions.

US 2012/0108733 A1 describes polyacrylate-based adhesive compounds which contain oligomeric silane bonding agents. The oligomeric silane bonding agents comprise alkoxysilyl and optional epoxy groups.

EP 0733689 A1 describes an adhesive compound based on chloroprene rubber which can include an oligomer of alkoxysilanes containing epoxy groups.

There is a continuing demand for adhesive compounds suitable for effective encapsulation of (opto)electronic systems. The object of the present invention was therefore to provide adhesive compounds showing high penetration times for water and also offering good adhesive performance.

FIG. 1 illustrates a test substrate comprising a calcium layer, and layered thereon: an adhesive compound, a thin glass sheet, a transfer adhesive tape and a PET film.

Achievement of this object is based on the concept of using a multifunctionalized polymeric getter material in the formulations. The first general subject matter of the present invention is an adhesive compound which comprises at least one elastomer and at least one reactive resin and is characterized in that the barrier adhesive compound comprises at least one polymer which contains at least two functional groups suitable for building a polymer and at least two hydrolyzable silyl groups. The barrier adhesive compounds according to the invention are easy to handle and simple to apply, have good adhesive properties, and provide high penetration times, particularly for water vapour even at higher temperatures.

A barrier adhesive compound is generally understood to be an adhesive compound with a water vapour permeation rate of less than 100 g/m$^2$d, preferably less than 50 g/m$^2$d, and more preferably less than 15 g/m$^2$d (at 37.5° C. and 90% relative humidity in each case). The barrier adhesive compound according to the invention can therefore also be referred to as a "water barrier adhesive compound" or an "adhesive compound with a barrier effect against water."

An elastomer is understood to be a polymer showing elastomeric behaviour that can be repeatedly elongated at 20° C. to at least twice its length and on removal of the force necessary for this elongation, immediately returns to approximately its original dimensions. In principle, according to the invention, all elastomers commonly used in the area of pressure-sensitive adhesive compounds are suitable for use, such as those described for example in the "Handbook of Pressure Sensitive Adhesive Technology" by Donatas Satas (Satas & Associates, Warwick 1999). The barrier adhesive compound according to the invention can contain one or a plurality of elastomers.

Particularly preferably, the elastomer is selected from the group composed of polyurethanes; natural rubbers; synthetic rubbers, particularly butyl, isobutyl, nitrile, and butadiene rubbers; vinyl aromatic block copolymers having elastomer blocks of unsaturated or partially or completely hydrated polydiene, particularly polybutadiene, polyisoprene, poly(iso)butylene blocks, and copolymer blocks thereof; polyolefins; fluoropolymers, and silicones.

If the elastomer is a rubber or synthetic rubber or blend thereof, the natural rubber can generally be selected from all available qualities, such as crepe, RSS, ADS, TSR, or CV types, depending on the required level of purity or viscosity, and the synthetic rubber or synthetic rubbers can be selected from the group of the randomly copolymerized styrene-butadiene rubbers (SBR), butadiene rubbers (BR), synthetic polyisoprenes (IR), butyl rubbers (IIR), halogenated butyl rubbers (XIIR), acrylate rubbers (ACM), ethylene vinyl acetate-copolymers (EVA), or polyurethanes and/or blends thereof.

Particularly preferably, the at least one elastomer of the barrier adhesive compound according to the invention is composed of at least one olefinic monomer, particularly in an amount of at least 50 wt. %, relative to the total weight of the elastomer, at least one olefinic monomer, or polyurethane. Most particularly preferably, the elastomer is a vinyl aromatic block copolymer.

If a plurality of elastomers are contained in the barrier adhesive compound according to the invention, these are preferably composed of at least one olefinic monomer, particularly in an amount of at least 50 wt. %, relative to the total weight of the elastomer, at least one olefinic monomer, or polyurethane. Particularly preferably, all of the elastomers of the barrier adhesive compound according to the invention are vinyl aromatic block copolymers.

The elastomer(s) is/are contained in the barrier adhesive compound according to the invention preferably to 20 to 50 wt. %, more preferably to 25 to 45 wt. %, and even more preferably to 28 to 40 wt. %, relative in each case to the total weight of the barrier adhesive compound.

A reactive resin is understood to be a compound that is liquid or liquefiable at room temperature, particularly also in the form of an oligomer or polymer, which cures by itself or together with reagents such as curing agents or accelerators. Reactive resins are also referred to in the context of the present invention as crosslinkable components. In general, all constituents known in the area of pressure-sensitive adhesive compounds or reactive adhesives, undergoing crosslinking in a construction reaction, and thus forming macromolecules may be used, such as those described for example in "Gerd Habenicht: Adhesives—Basis, Technologies, Applications", 6th Edition, Springer, 2009. These are for example constituents such as epoxide resins and/or phenol, cresol or novolac-based resins or constituents forming polyesters, polyethers, polyurethanes, polysulfides, or (meth)acrylate polymers.

The at least one reactive resin preferably contains cyclic ether groups, and particularly preferably at least two epoxy or oxetane groups. These reactive resins may be in monofunctional, difunctional, trifunctional, tetrafunctional or higher functional configurations, up to polyfunctional configurations, with the functionality referring to the cyclic ether group. The at least one reactive resin is preferably an aliphatic substance. Also preferably, the at least one reactive resin is suitable for radiochemical and/or thermal crosslinking with a softening temperature of less than 40° C., preferably of less than 20° C.

The at least one reactive resin is preferably selected from the group composed of 3,4-epoxycyclohexylmethyl-3',4'-epoxycyclohexanecarboxylate (EEC) and its derivatives, dicyclopentadiene dioxide and its derivatives, 3-ethyl-3-oxetane methanol and its derivatives, tetrahydrophthalic acid diglycidyl ester and its derivatives, hexahydrophthalic acid diglycidyl ester and its derivatives, 1,2-ethanediglycidyl ether and its derivatives, 1,3-propanediglycidyl ether and its derivatives, 1,4-butanedioldiglycidyl ether and its derivatives, higher 1,n-alkanediglycidyl ether and its derivatives, bis-[(3,4-epoxycyclohexyl)methyl]-adipate and its derivatives, vinyl cyclohexyl dioxide and its derivatives, 1,4-cyclohexanedimethanol-bis-(3,4-epoxycyclohexanecarboxylate) and its derivatives, 4,5-epoxytetrahydrophthalic acid diglycidyl ester and its derivatives, bis-[1-ethyl(3-oxetanyl)methyl] ether and its derivatives, pentaerythritol tetraglycidyl ether and its derivatives, bisphenol-A-diglycidyl ether (DGEBA), hydrated bisphenol-A-diglycidyl ether, bisphenol-F-diglycidyl ether, hydrated bisphenol-F-diglycidyl ether, epoxyphenol novolacs, hydrated epoxyphenol novolacs, epoxycresol novolacs, hydrated epoxycresol novolacs, 2-(7-oxabicyclo-spiro[1,3-dioxane-5,3'-[7]oxabicyclo[4.1.0]-heptane] and 1,4-bis((2,3-epoxypropoxy)methyl)cyclohexane, respectively in monomeric, dimeric, trimeric, etc., to oligomeric form. The reactive resins may be used in their monomeric as well as dimeric, trimeric, etc. up to their oligomeric form. Mixtures of reactive resins with one another, but also with other coreactive bonds such as alcohols (monofunctional or multifunctional) or vinyl ethers (monofunctional or multifunctional) are possible according to the invention.

Particularly preferably, the at least one reactive resin is 3,4-epoxycyclohexylmethyl-3',4'-epoxycyclohexanecarboxylate (EEC) or bis-[(3,4-epoxycyclohexyl)methyl]-adipate, or a respective di-, tri-, etc., up to oligomer thereof. These reactive resins are particularly well suited for cationic curing. Such curing can be technically managed to the best extent compared to alternative methods. In additions, these reactive resins provide particularly good barrier properties.

The content of the reactive resins in the barrier adhesive compound according to the invention is preferably 15 to 80 wt. %, particularly preferably 20 to 70 wt. %, and most particularly preferably 25 to 65 wt. %, relative in each case to the total weight of the barrier adhesive compound. Particularly preferred is also a reactive resin content of 15 to 35 wt. %, and particularly 20 to 30 wt. %. With such a percentage by weight of the reactive resins, particularly favourable handling and elasticity of the adhesive compound after curing can be achieved. For more strongly crosslinked adhesive bonds, reactive resin contents of 65 to 80 wt. % are preferred. Reactive resin contents of 35 to 65 wt. %, relative in each case to the total weight of the barrier adhesive compound, are particularly well-balanced with respect to elasticity and degree of crosslinking. In this manner, adhesive bonding or encapsulation of electronic components can be achieved that is characterized both by increased flexibility and outstanding barrier properties, thus combining two generally contradictory properties.

The construction or the structure of the at least one polymer G is generally not critical, provided that the polymer G contains at least two functional groups suitable for building a polymer and at least two hydrolyzable silyl groups. The at least one polymer G has a poly(meth)acrylate backbone. In particular, the monomer base of the polymer G is composed in an amount of at least 50 wt. % of acrylic and/or methacrylic esters. The polymer G is therefore preferably a poly(meth)acrylate.

A "functional group suitable for the structure of a polymer" is understood to refer to a functional group by means of which a polymerization reaction can take place, i.e. a chemical reaction with identical or different functional groups, by means of which polymers are constructed from monomers or oligomeric intermediates. In this case, it is generally unimportant whether the polymerization reaction takes place continuously in the sense of polymerization, i.e. only by the reaction of monomers with the growing polymer chain, or stepwise in the sense of polyaddition or polycondensation, i.e. by the combining of pre-stages first formed by the monomers. Preferably, the functional groups suitable for building a polymer are selected independently of one another from the group composed of vinyl groups, (meth) acrylate groups, hydroxy groups, amino groups, isocyanate groups and cyclic ether groups. The terms "(meth)acrylate" and "poly(meth)acrylate" are understood in the context of the present invention to include both acrylic and methacrylic acid-based bonds, which can be present both alternately concurrently. Particularly preferably, the functional groups suitable for building a polymer are selected independently from one another from (meth)acrylate groups and cyclic ether groups. Most particularly preferably, the functional groups suitable for building a polymer are cyclic ether groups, particularly epoxy groups, for example epoxycycloalkyl groups.

Particularly preferably, the at least one reactive resin and the at least one polymer G have similar, and preferably identical functional groups suitable for building a polymer. In this case, the reactive resin and polymer G can crosslink with each other in a particularly favourable manner. Here, "similar functional groups suitable for building a polymer" are understood to be those which are very similar to one another chemically—for example, differing only in one substituent or the number of ring members—and with respect to the polymer-building reaction, react mechanistically in an identical manner, e.g. cyclic ether groups with different ring sizes or different acrylate and/or methacrylate groups. Nevertheless, the reactive resin and the polymer G are generally chemically different bonds. This means that the polymer G and the reactive resin in the adhesive compound of the invention cannot be present in the form of a (single) compound, which would be to be referred to both as polymer G and as a reactive resin.

A "hydrolyzable silyl group" is understood to be a group in the form —SiR$_3$, wherein the substituents R, independently of one another, are first any desired organic groups, but at least one of the substituents can be split off from the silicon atom by means of a chemical reaction with water. Preferably, the hydrolyzable silyl groups correspond to formula (I)

$$—Si(OR^1)_x R^2_{3-x} \quad (I),$$

wherein the substituents R$^1$, independently of one another, denote a methyl or ethyl residue, the substituents R$^2$, independently of one another, denote an alkyl or aryl residue, and x=1 to 3. Particularly preferably, the substituents R$^1$ stand for a ethyl residue. Also particularly preferable is x=2 or 3. Most particularly preferably, the hydrolyzable silyl groups comprise triethoxysilyl groups.

On the one hand, the special substituent pattern of the polymer(s) G advantageously allows the polymers to be incorporated into the network of the reactive resin. On the other hand, suitable functional groups for binding permeates, particularly water, are incorporated into the pressure-sensitive adhesive compound. The polymer G can therefore also be referred to as a "getter polymer" or "polymeric getter". As the polymers G are incorporated into the network of the reactive resin, in the barrier adhesive compound according to the invention, an increasing or even existing content of permeates, particularly water-bonding functional groups do not cause the network point density of the system to be decreased. Compared to monomeric and oligomeric getters, it is therefore possible to significantly increase the efficiency of the getter effect.

The production of the polymers G is possible on the one hand by copolymerization and on the other by polymer-analogous reactions.

Copolymerization can take place with monomers A, which after radical polymerization contain one further reactive group, for example cyclic ethers such as aliphatic epoxides and oxetanes, monomers B, which carry hydrolyzable silyl groups, and backbone monomers C.

Examples of monomers A are 3,4-epoxycyclohexylmethylmethacrylate (CAS: 82428-30-6), 2,3-epoxypropylmethacrylate (CAS: 106-91-2), and 2,3-epoxypropylacrylate (CAS: 106-90-1).

Examples of monomers B are 3-(triethoxysilyl)propylmethacrylate (CAS: 21142-29-0), 3-(triethoxysilyl)propylacrylate (CAS: 20208-39-3), 3-(trimethoxysilyl)propylacrylate (CAS: 4369-14-6), 3-(trimethoxysilyl)propylmethacrylate (CAS: 2530-85-0), methacryloxymethyltriethoxysilane (CAS: 5577-72-0), (methacryloxymethyl)trimethoxysilane (CAS: 54586-78-6), (3-acryloxypropyl)methyldimethoxysilane (CAS: 13732-00-8), (methacryloxymethyl)methyldimethoxysilane (CAS: 121177-93-3), γ-methacryloxypropylmethyldimethoxysilane (CAS: 3978-58-3), methacryloxypropylmethyldiethoxysilane (CAS: 65100-04-1), 3-(dimethoxymethylsilyl) propylmethacrylate (CAS: 14513-34-9), methyacryloxypropyldimethylethoxysilane (CAS: 13731-98-1), and methacryloxypropyldimethylmethoxysilane (CAS: 66753-64-8).

Examples of monomers C are all radical polymerizable monomers known to the person skilled in the art, preferably acrylate and methacrylate.

Polymeric getters can be produced from monomers A and B or mixtures of monomers A and B, as well as monomers C.

Production via polymer-analogous reactions can take place in such a way that polymers with reactive side groups are first produced. In a second step, these are functionalized with epoxides and alkoxysilanes. Typical polymer-analogous coupling reactions take place via isocyanates that react with amines or alcohols, esterification reactions, transesterifications, anhydrides that react with alcohols or amines, or nucleophilic attacks of alcohols or amines on halogen atom-bearing carbon atoms.

Preferably, the barrier adhesive compound according to the invention contains a total of 0.5 to 30 wt. %, relative to the total weight of the adhesive compound, of polymers G. It may contain one or a plurality of polymer(s) G.

In a special embodiment, the barrier adhesive compound according to the invention contains a total of 0.5 to 2 wt. % of polymers G. With this content, the negative affect of the polymeric getters, which are polar compared to the adhesive compound, on the permeation of water is reduced.

In a further special embodiment, the adhesive compound according to the invention contains a total of 15 to 30 wt. % of polymers G. In this embodiment, the adhesive compound has a particularly high water absorption capacity.

In a particularly preferred embodiment, the adhesive compound according to the invention contains a total of 2 to 15 wt. % of polymers G. In this case, the adhesive compound is particularly well-balanced with respect to low permeation of water and water absorption capacity.

Moreover, the adhesive compound according to the invention preferably comprises at least one initiator, particularly preferably at least one initiator for cationic UV crosslinking. In particular, sulfonium, iodonium, and metallocene-based systems are preferred as initiators. With respect to sulfonium-based cations, reference is made to the presentations in U.S. Pat. No. 6,908,722 B1 (particularly columns 10 to 21).

Examples of anions, which serve as counterions for the above cations include tetrafluoroborate, tetraphenylborate, hexafluorophosphate, perchlorate, tetrachloroferrate, hexafluoroarsenate, hexafluoroantimonate, pentafluorohydroxyantimonate, hexachloroantimonate, bis-(trifluoromethylsulfonyl)amide and tris-(trifluoromethylsulfonyl)methanide. Moreover, particularly for iodonium-based initiators, chloride, bromide, or iodide are conceivable as anions, but initiators which are essentially free of chlorine and bromine are preferred.

More specifically, useable initiators include:
sulfonium salts such as triphenylsulfonium hexafluoroarsenate, triphenylsulfonium hexafluoroborate, triphenylsulfonium tetrafluoroborate, methyldiphenylsulfonium tetrafluoroborate, dimethylphenylsulfonium hexafluorophosphate, triphenylsulfonium hexafluorophosphate, triphenylsulfonium hexafluoroantimonate, diphenylnaphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-chlorophenyldiphenylsulfonium hexafluoroantimonate, tris-(4-phenoxyphenyl)-sulfonium hexafluorophosphate, di-(4-ethoxyphenyl)-methylsulfonium hexafluoroarsenate, 4-acetylphenyldiphenylsulfonium tetrafluoroborate, tris-(4-thiomethoxyphenyl)sulfonium hexafluorophosphate, di-(methoxysulfonylphenyl)methylsulfonium hexafluoroantimonate, di-(methoxynaphthyl)methylsulfonium tetrafluoroborate, di-(carbomethoxyphenyl)methylsulfonium hexafluorophosphate, (4-octyloxyphenyl)diphenylsulfonium tetrakis-(3,5-bis-trifluoromethylphenyl)borate, tris-(dodecylphenyl)sulfonium tetrakis-(3,5-bis-trifluoromethylphenyl)borate, 4-acetamide phenyldiphenylsulfonium tetrafluoroborate, dimethylnaphthylsulfonium hexafluorophosphate, trifluoromethyldiphenylsulfonium tetrafluoroborate, phenylmethylbenzylsulfonium hexafluorophosphate, 5-methylthianthrenium hexafluorophosphate, 10-phenyl-9,9-dimethylthioxantheniumhexafluorophosphate, 10-phenyl-9-oxothioxantheniumtetrafluoroborate, 5-methyl-10-oxothianthrenium tetrafluoroborate and 5-methyl-10,10-dioxothianthrenium hexafluorophosphate, iodonium salts such as diphenyliodonium tetrafluoroborate, di-(4-methylphenyl)iodonium tetrafluoroborate, phenyl-4-methylphenyliodonium tetrafluoroborate, di-(4-chlorphenyl)iodonium hexafluorophosphate, dinaphthyliodonium tetrafluoroborate, di-(4-trifluormethylphenyl)iodonium tetrafluoroborate, diphenyliodonium hexafluorophosphate, di-(4-methylphenyl)iodonium hexafluorophosphate, diphenyliodonium hexafluoroarsenate, di-(4-phenoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di-(2,4-dichlorphenyl)iodonium hexafluorophosphate, di-(4-bromphenyl)iodonium hexafluorophosphate, di-(4-methoxyphenyl)iodonium hexafluorophosphate, di-(3-carboxyphenyl)iodonium hexafluorophosphate, di-(3-methoxycarbonylphenyl)iodonium hexafluorophosphate, di-(3-methoxysulfonylphenyl)iodonium hexafluorophosphate, di-(4-acetamidophenyl)iodonium hexafluorophosphate, di-(2-benzothienyl)iodonium hexafluorophosphate, diaryliodonium tristrifluormethylsulfonylmethide such as diphenyliodonium hexafluoroantimonate, (4-n-Desiloxyphenyl)phenyliodonium hexafluoroantimonate, [4-(2-hydroxy-n-tetradesiloxy)phenyl]-phenyliodonium hexafluoroantimonate, [4-(2-hydroxy-n-tetradesiloxy)phenyl]-phenyliodonium trifluorosulfonate, [4-(2-hydroxy-n-tetradesiloxy)phenyl]-phenyliodonium hexafluorophosphate, bis-(4-tert-butylphenyl)iodonium hexafluoroantimonate, bis-(4-tert-butylphenyl)iodonium hexafluorophosphate, bis-(4-tert-butylphenyl) iodonium trifluorosulfonate, bis-(4-tert-butylphenyl) iodonium tetrafluoroborate, bis-(dodecylphenyl) iodonium hexafluoroantimonate, bis-(dodecylphenyl) iodonium tetrafluoroborate, bis-(dodecylphenyl) iodonium hexafluorophosphate, bis-(dodecylphenyl) iodonium trifluoromethylsulfonate, di-(dodecylphenyl) iodonium hexafluoroantimonate, di-(dodecylphenyl) iodonium triflate, diphenyliodonium bisulfate, 4,4'-dichlorodiphenyliodonium bisulfate, 4,4'-dibromodiphenyliodonium bisulfate, 3,3'-dinitrodiphenyliodonium bisulfate, 4,4'-dimethyldiphenyliodonium bisulfate, 4,4'-bis-succinimidodiphenyliodonium bisulfate, 3-Nitrodiphenyliodonium bisulfate, 4,4'-dimethoxydiphenyliodonium bisulfate and (4-octyloxyphenyl)phenyliodonium tetrakis-(3,5-bis-trifluoromethylphenyl) borate, and Ferrocenium salts such as η5-(2,4-cyclopentadien-1-yl) [(1,2,3,4,5,6,9)-(1-methylethyl)-benzene]iron.

One or a plurality of initiators may be included.

Preferably, the adhesive compound according to the invention comprises at least one adhesive resin. Particularly preferably, the adhesive compound according to the invention contains at least one at least partially hydrated adhesive resin, particularly one that is compatible with the elastomer components or, if a copolymer constructed of hard and soft blocks is used as elastomer components, one that is chiefly compatible with the soft block (soft resin).

Preferably, the at least one adhesive resin has a softening temperature measured by means of the ring and ball method of greater than 25° C. Particularly preferably, the adhesive compound also contains at least one adhesive resin with a softening temperature of less than 20° C. This can advantageously be achieved by finely adjusting the adhesive behaviour on the one hand and the application behaviour on the adhesive backing on the other.

If the elastomer or elastomers of the barrier adhesive compound according to the invention are relatively non-polar, partially or completely hydrated resins based on colophony and colophony derivatives, hydrated polymerizate of dicyclopentadienes, partially, selectively, or completely hydrated hydrocarbon resins based on $C_5$-, $C_5/C_9$- or $C_9$ monomer flows, polyterpene resins based on α-pinene and/or ß-pinene and/or δ-limonene and/or $\Delta^3$-carene, and hydrated polymerizates, preferably of pure $C_8$- and $C_9$-aromatics can advantageously be included as adhesive resins in the adhesive compound of the invention. The aforementioned adhesive resin can be used both alone or in a mixture. Resins that are either solid or liquid at room temperature may be used. In order to ensure high aging resistance and UV stability, hydrated resins with a degree of hydration of at least 90%, and preferably at least 95%, are preferred.

The barrier adhesive compound according to the invention is preferably a pressure-sensitive adhesive compound. A pressure-sensitive adhesive compound is understood according to the invention, as is generally accepted, to refer to a substance which—particularly at room temperature—is permanently tacky and adhesive. It is characteristic of a pressure-sensitive adhesive that it can be applied by pressure to a substrate and remains adhering thereto, with the pressure to be applied and the duration of this application not being further specified. In cases, depending on the exact type of the pressure-sensitive adhesive, the temperature, and the humidity, as well as the substrate, the application of a brief, minimal pressure, which does not go beyond slight pressure for a brief moment, is sufficient too achieve the adhesive effect, but in other cases, longer-term application of a high pressure may be necessary.

Pressure-sensitive adhesives have special, characteristic viscoelastic properties that result in prolonged tackiness and adhesiveness. It is characteristic of these adhesives that when they are mechanically deformed, this results in both viscous flow processes and also to the formation of elastic return forces. With respect to their respective components, the two processes are in a specified relation to each other, depending both on the exact composition, the structure, and the degree of crosslinking of the pressure-sensitive adhesive and the speed and duration of deformation, as well as the temperature.

The proportional viscous flow is necessary to achieve adhesion. Only the viscous components, produced by macromolecules with relatively high mobility, allow good moistening and good application to the substrate to be bonded. A high proportion of viscous flow leads to pressure adhesiveness (also referred to as tack or surface adhesiveness) and thus often also to a high adhesive force. Strongly crosslinked systems, crystalline polymers, or polymers solidified in a glasslike manner are generally not, or at least only slightly tacky because of the lack of flowable components.

The proportional elastic return forces are necessary to achieve cohesion. They are generated for example by highly long-chain and strongly entangled and physically or chemically crosslinked macromolecules and allow the forces acting on an adhesive bond to be transferred. They allow an adhesive bond to withstand a prolonged stress acting on it, for example in the form of prolonged shear stress, to a sufficient degree and over a long period.

The parameters storage modulus (G') and loss modulus (G"), which can be determined by means of dynamic mechanical analysis (DMA), can be used for more precise description and quantification of the extent of the elastic and viscous components and the mutual relationship of these components. G' is a measure of the elastic component, and G" is a measure of the viscous component of a material. The two parameters are dependent on frequency of deformation and the temperature.

The parameters can be determined using a rheometer. For example, the material to be tested is subjected to a sinusoidally oscillating shear stress in a plate-plate device. In the case of shear stress controlled devices, deformation is measured as a function of time, and the lateral displacement of this deformation is measured with respect to the introduced shear stress. This temporal displacement is referred to as phase angle δ. Storage modulus G' is defined as follows: $G' = (\tau/\gamma) \cdot \cos(\delta)$ ($\tau$=shear stress, $\gamma$=deformation, $\delta$=phase angle=phase displacement between shear stress and deformation vector). The definition of the modulus G" is as follows: $G'' = (\tau/\gamma) \cdot \sin(\delta)$ ($\tau$=shear stress, $\gamma$=deformation, $\delta$=phase angle=phase displacement between shear stress and deformation vector).

A substance is generally considered tacky and is defined within the meaning of the invention as tacky if at room temperature, here by definition 23° C., it is in the deformation frequency range of $10^0$ to $10^1$ rad/sec G', at least partially in the range of $10^3$ to $10^7$ Pa, and if G" is also at least partly in this range. "Partially" means that at least a section of the G' curve is within the window delimited by the deformation frequency range of $10^0$ inclusively to $10^1$ rad/sec inclusively (abscissa) and the range of the G' value of $10^3$ inclusively to $10^7$ Pa inclusively (ordinate). This applies correspondingly to G".

Further subject matter of the invention is an adhesive tape which comprises a barrier pressure-sensitive adhesive compound according to the invention. Here, the general term "adhesive tape" comprises a carrier material that is provided on one or both sides with a pressure-sensitive adhesive compound. The carrier material comprises all sheetlike structures, for example films or film sections extended in two dimensions with extended length and limited width, tape sections, punched items (for example in the form of borders or edges of an (opto)electronic device), multilayer arrangements, and the like. This makes it possible to combine the widest possible variety of substrates for various applications, such as films, fabrics, webs, and papers, with the adhesive compounds.

The term "adhesive tape", also referred to as "transfer adhesive tapes", refers to adhesive tapes without a carrier. In the case of a transfer adhesive tape, however, prior to application, the adhesive compound is placed between flexible liners which are provided with a separating layer and/or have anti-adhesive properties. Ordinarily, for the application process, a liner is removed, the adhesive compound is applied, and the second liner is then removed. In this way, the adhesive compound can be directly used for bonding of two surfaces in (opto)electronic devices.

However, adhesive tapes are also possible in which one works not with two liners, but with a single liner equipped with two separating sides. The adhesive tape web is then covered on its upper side with the one side of the liner equipped with two separating sides and on the underside with the back surface of the liner with two separating sides, where it in particular is next to an adjacent turn on a ball or roll.

The carrier material of the adhesive tape according to the invention is preferably a polymer film, a film composite, or (a) film(s) provided with organic and/or inorganic layers or a film composite. Such films/film composites may be composed of all plastics commonly used for film production, with the following being given as examples:

Polyethylene, polypropylene—particularly oriented polypropylene (OPP) produced by mono- or biaxial stretching, cyclic olefin copolymers (COC), polyvinylchloride (PVC), polyesters—particularly polyethylene terephthalate (PET) and polyethylene naphthalate (PEN), ethylene vinyl alcohol (EVOH), polyvinylidene chloride (PVDC), polyvinylidene fluoride (PVDF), polyacrylonitrile (PAN), polycarbonate (PC), polyamide (PA), polyether sulfone (PES), or polyimide (PI).

In double-sided adhesive tapes, adhesive compounds according to the invention of the same or different types can be used as the upper and lower layer, and/or the same or different layer thickness may be used. In this case, the carrier may be correspondingly pretreated on one or both sides according to prior art, so that for example an improvement in the anchoring of the adhesive compounds is achieved. Moreover, one or both sides may be equipped with a functional layer, which can function for example as a barrier layer. The pressure-sensitive adhesive layers can optionally be covered with separating papers or separating films. Alternatively, it is possible for only one adhesive compound layer to be covered with a double-sided separating liner.

In a variant the double-sided adhesive tape is provided with an adhesive compound according to the invention as well as any further compound, for example, one that adheres particularly well to a covering substrate or shows particularly good repositionability.

The thickness of the pressure-sensitive adhesive compound, which is configured either as a transfer adhesive tape or is coated onto a sheetlike structure, is preferably between 1 μm and 2000 μm, more preferably between 5 μm and 500 μm, and particularly preferably between 12 μm and 250 μm.

Layer thicknesses between 50 μm and 150 μm are preferably used when improved adhesion to the substrate and/or a damping effect is to be achieved.

Layer thicknesses of between 1 μm and 50 μm reduce the amount of material. However, this also reduces the adhesion to the substrate.

In double-sided adhesive tapes, it also applies for adhesive compound(s) that the thickness of the individual pressure-sensitive adhesive layer(s) is preferably between 1 μm and 2000 μm, more preferably between 5 μm and 500 μm, and particularly preferably between 12 μm and 250 μm. In double-sided adhesive tapes, if another compound in addition to the one adhesive compound of the invention is used, it can also be advantageous for its thickness to be greater than 150 μm.

Further subject matter of the invention is the use of a barrier adhesive compound according to the invention for the gluing or sealing of electronic, preferably (opto)electronic devices, particularly electrophoretic or electrochromic structures or displays and organic or polymeric light-emitting diodes (OLEDs or PLEDs) in advertising or display devices or as illumination, electroluminescent lamps, light-emitting electrochemical cells (LEECs), organic solar cells such as dye or polymeric solar cells, organometallic solar cells, for example based on metal organic frameworks (MOFs) with crystalline porphyrin coatings, inorganic solar cells, for example thin-layer solar cells, particularly based on silicon, germanium, copper, indium or selenium, organic field effect transistors, organic switching elements, organic optical amplifiers, organic laser diodes, organic or inorganic sensors, and organic or inorganic-based RFID transponders.

EXAMPLES

Measurement Methods
Determination of Penetration Time
Accelerated Life Test

A calcium test was conducted as a measure of determination of the useful life of an electronic structure. This is shown in FIG. 1. For this purpose, a 10×10 mm² large, thin calcium layer 23 was deposited in a vacuum on a glass plate 21 and then stored in a nitrogen atmosphere. The thickness of the calcium layer 23 was approximately 100 nm. For encapsulation of the calcium layer 23, an adhesive tape (23×23 mm²) with the adhesive compound to be tested 22 and a thin glass sheet 24 (35 μm, manufactured by Schott) was used as a carrier material. For stabilization, the thin glass sheet was laminated with a 100 μm thick PET film 26 by means of a 50 μm thick transfer adhesive tape 25 from a highly optically transparent acrylate pressure-sensitive adhesive compound. The adhesive compound 22 was applied to the glass plate 21 in such a way that the adhesive compound 22 covered the calcium level 23 with an edge protruding on all sides measuring 6.5 mm (A-A). Because of the opaque glass carrier 24, only the permeation through the pressure-sensitive adhesive or along the interfaces was determined.

The test is based on the reaction of calcium with water vapour and oxygen, as described for example by A. G. Erlat et al. in "47th Annual Technical Conference Proceedings—Society of Vacuum Coaters," 2004, pp. 654 to 659, and M. E. Gross et al. in "46th Annual Technical Conference Proceedings—Society of Vacuum Coaters," 2003, pp. 89 to 92. In this case, the optical transmission of the calcium layer, which increases with the conversion into calcium hydroxide and calcium oxide, is monitored. This conversion took place in the test structure described beginning from the edge, so that the visible surface of the calcium level decreased. The time required for reducing the light absorption of the calcium level by half is referred to as useful life. This method allowed determination of both the reduction in the area of the calcium level beginning from the edge and the local decrease in the area, as well as the homogeneous decrease in the layer thickness of the calcium level by full-surface degradation.

60° C. and 90% relative humidity were selected as measurement conditions. The sample was bonded over the entire area and blister-free with a layer thickness of the pressure-sensitive adhesive compound of 50 μm. The reduction in the Ca level was followed by means of transmission measurements. The penetration time is defined as the time required by moisture to cross the distance to the Ca. During this time, the transmission of the Ca level changes only marginally.

Adhesive Compound Layers
Starting Materials Used:

| | |
|---|---|
| Sibstar 62M | SiBS (polystyrene-block-polyisobutylene-block copolymer, M = 60.000 g/mol) manufactured by Kaneka with 20 wt. % block polystyrene content. The glass transition temperature of the polystyrene block was 100° C. and that of the polyisobutylene block was −60° C. The SiBS had a diblock content of 36 wt. %. |
| Uvacure 1500 | Cycloaliphatic diepoxide manufactured by Cytec |
| Escorez 5300 | Fully hydrated hydrocarbon resin manufactured by Exxon (ring and ball 105° C., DACP = 71, MMAP = 72) |
| 3-Glycidoxypropyltrimethoxysilane | Epoxy-modified trimethoxysilane (CAS: 2530-83-8) |
| Shin-Etsu X12-981S | Polymeric getter with triethoxysilyl and epoxy side groups, epoxy equivalent = 290 g/mol, ratio (number of groups) epoxy/ethoxysilyl = 3 |
| Triarylsulfonium hexafluoroantimonate | Cationic photoinitiator from Sigma-Aldrich The photoinitiator shows an absorptions maximum in the range of 320 nm to 360 nm and was in the form of a 50 wt. % solution in propylene carbonate |

Example 1

For the production of adhesive compound layers, various adhesive compounds were applied from a solution to a conventional liner (siliconized polyester film) by means of a laboratory application device and dried. The adhesive compound layer thickness after drying was 50±5 μm. Drying was carried out in each case first at RT for 10 minutes and then for 10 minutes at 120° C. in a laboratory drying cabinet. The respective dried adhesive compound layers were immediately laminated with a second liner (siliconized polyester film with low separating force) on the open side.

Sibstar 62M, Escorez 5300, Uvacure 1500, and the silyl functional polymeric getter (see Table 1 for parts by weight) were dissolved in a mixture of toluene (300 g), acetone (150 g), and special boiling point solvent 60/95 (550 g), giving rise to a 50 wt. % solution. After this, triarylsulfonium hexafluoroantimonate was added to the solution as a photoinitiator.

By means of a doctor blade method, the formulation was coated from solution onto a siliconized PET liner and dried at 120° C. for 15 min. The amount of the compound applied was 50 g/m$^2$. The sample was covered with a further layer of a PET layer that was also siliconized but separated more easily.

The sample was sluiced into a glove box. A portion of the sample was laminated in a blister-free manner with a rubber application roller onto a Ca-vapour-plated glass substrate. This was covered with the second PET liner, and a layer of a thin sheet glass was laminated onto it. After this, curing was carried out through the covering glass by UV irradiation (dose: 80 mJ/cm$^2$; lamp type: non-doped mercury lamp). This sample was used for the accelerated life test.

TABLE 1

Compositions

| | K1 wt. % | K2 wt. % | K3 wt. % | K4 wt. % | V1 wt. % | V2 wt. % | V3 wt. % | V4 wt. % | V5 wt. % |
|---|---|---|---|---|---|---|---|---|---|
| Example: | | | | | | | | | |
| SiBStar 62M | 35.5 | 34.7 | 33.6 | 31.7 | 37.5 | 35.5 | 34.7 | 33.6 | 31.7 |
| Uvacure 1500 | 24 | 23.5 | 22.7 | 21.5 | 25 | 24 | 23.5 | 22.7 | 21.5 |
| Shin-Etsu X12-981S | 5 | 7 | 10 | 15 | 0 | 0 | 0 | 0 | 0 |
| 3-Glycidoxypropyl-trimethoxysilane | 0 | 0 | 0 | 0 | 0 | 5 | 7 | 10 | 15 |
| Escorez 5300 | 35.4 | 34.7 | 33.6 | 31.7 | 37.4 | 35.4 | 34.7 | 33.6 | 31.7 |
| Triarylsulfonium hexafluoroantimonate | 0.1 | 0.1 | 0.1 | 0.1 | 0.1 | 0.1 | 0.1 | 0.1 | 0.1 |

The water penetration times in the Ca test are shown in Table 2:

TABLE 2

Penetration times in climate testing 60° C./90% rH)

| Name | 5% Getter penetration time (h) | 7% Getter penetration time (h) | 10% Getter penetration time (h) | 15% Getter penetration time (h) |
|---|---|---|---|---|
| K1-K4 (getter X12-981S) | 1250 | 1400 | 1450 | 1550 |
| V2-V5 (getter (3-glycidyloxypropyl) trimethoxysilane)) | 1050 | 1175 | 980 | 720 |

The penetration times for pressure-sensitive adhesives with the polymeric multifunctional getter according to the invention are significantly improved compared to low-molecular trimethoxysilanes (V2-V5). This is surprising, because the low-molecular weight getter contains a larger number of hydrolyzable groups per mass unit. Presumably, this is attributable to the fact that the groups of the getter according to invention that are capable of polymerization are involved in the reaction during the curing step, and the network density is therefore not reduced as in the case of low-molecular getter.

The invention claimed is:
1. A barrier adhesive compound, comprising
at least one elastomer and
at least one reactive resin,
wherein;
the barrier adhesive compound comprises at least one polymer G, containing at least two functional groups capable of building a polymer and at least two hydrolyzable silyl groups.
2. The barrier adhesive compound of claim 1, wherein the at least one polymer G has a polyacrylate backbone.
3. The barrier adhesive compound of claim 1, wherein the functional groups capable of building a polymer are selected independently of one another, and are selected from the group consisting of: vinyl groups, (meth)acrylate groups, hydroxy groups, amino groups, isocyanate groups, cyclic ether groups, and epoxy groups.
4. The barrier adhesive compound of claim 1, wherein the functional groups capable of building a polymer are selected independently from one another, and are selected from: (meth)acrylate groups and epoxy groups.
5. The barrier adhesive compound of claim 1, wherein the functional groups capable of building a polymer comprise epoxycycloalkyl groups.
6. The barrier adhesive compound of claim 1, wherein the hydrolyzable silyl groups correspond to formula (I)

$$—Si(OR^1)_x R^2_{3-x} \qquad (I),$$

in which:
R$^1$ is a methyl and/or an ethyl residue; and,
R$^2$, is an alkyl and/or an aryl residue; and,
x=1 to 3.
7. The barrier adhesive compound of claim 6, wherein each R$^1$ is an ethyl residue.
8. The barrier adhesive compound of claim 6, wherein x=2 or 3.
9. The barrier adhesive compound of claim 1, wherein the at least one elastomer is a vinyl aromatic block copolymer.
10. The barrier adhesive compound of claim 1, wherein the at least one reactive resin contains cyclic ether groups.
11. The barrier adhesive of claim 1 which contains 15-80% wt. of a reactive resin based on the total weight of the barrier adhesive compound.
12. The barrier adhesive compound of claim 1, wherein the barrier adhesive compound is a pressure-sensitive adhesive compound.
13. An adhesive tape, comprising a barrier adhesive compound of claim 12.
14. A method of sealing of electronic devices comprising the step of:

applying the barrier adhesive compound of claim 1 to a
  surface of the electronic device.

* * * * *